(12) United States Patent
Matsushiba et al.

(10) Patent No.: US 7,782,621 B2
(45) Date of Patent: Aug. 24, 2010

(54) CIRCUIT MODULE AND MANUFACTURING METHOD THEREOF

(75) Inventors: Takuji Matsushiba, Kanagawa (JP); Aya Minami, Kanagawa (JP); Yohichi Miwa, Kabnagawa (JP); Taichiroh Nomura, Kanagawa (JP); Kenji Tsuboi, Kanaawa (JP); Takeshi Wagatsuma, Kanagawa (JP); Masatake Yamamoto, Kanagawa (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/263,558

(22) Filed: Nov. 3, 2008

(65) Prior Publication Data

US 2009/0116194 A1    May 7, 2009

(30) Foreign Application Priority Data

Nov. 6, 2007    (JP) .............................. 2007-288943

(51) Int. Cl.
    *H05K 7/20* (2006.01)
(52) U.S. Cl. ....................... 361/714; 361/719; 361/700; 361/715; 165/80.3; 165/185; 257/712; 257/718; 257/719; 174/16.3; 174/252
(58) Field of Classification Search ............ 361/679.46, 361/679.52, 679.54, 688, 689, 704–712, 361/714–722, 767–771, 785; 165/80.3, 80.5, 165/104.33, 185; 257/706–727; 174/15.1, 174/16.3, 252
See application file for complete search history.

(56) References Cited

U.S. PATENT DOCUMENTS

| | | | | |
|---|---|---|---|---|
| 4,563,725 A | * | 1/1986 | Kirby ......................... | 361/708 |
| 5,065,279 A | * | 11/1991 | Lazenby et al. ............. | 361/720 |
| 5,432,679 A | * | 7/1995 | Grabbe ....................... | 361/769 |
| 5,812,375 A | * | 9/1998 | Casperson ................... | 361/707 |
| 5,825,625 A | * | 10/1998 | Esterberg et al. ............ | 361/719 |
| 5,969,940 A | * | 10/1999 | Sano et al. ............. | 361/679.52 |
| 6,219,243 B1 | * | 4/2001 | Ma et al. ..................... | 361/704 |
| 6,365,964 B1 | * | 4/2002 | Koors et al. ................. | 257/718 |
| 6,404,639 B1 | * | 6/2002 | Wakabayashi et al. ...... | 361/719 |
| 6,490,161 B1 | * | 12/2002 | Johnson ...................... | 361/704 |
| 6,615,864 B2 | * | 9/2003 | Chang ........................ | 137/521 |
| 6,700,195 B1 | * | 3/2004 | Mandel ....................... | 257/718 |
| 6,809,931 B2 | * | 10/2004 | Dove et al. .................. | 361/707 |
| 6,998,706 B2 | * | 2/2006 | Lawlyes ...................... | 257/712 |
| 6,999,317 B2 | * | 2/2006 | Chengalva et al. .......... | 361/715 |
| 7,023,699 B2 | * | 4/2006 | Glovatsky et al. ........... | 361/704 |
| 7,106,588 B2 | * | 9/2006 | Oberlin et al. .............. | 361/700 |
| 7,187,553 B2 | * | 3/2007 | Schmidberger ............. | 361/719 |

FOREIGN PATENT DOCUMENTS

JP    08-222671    8/1996

* cited by examiner

*Primary Examiner*—Michael V Datskovskiy
(74) *Attorney, Agent, or Firm*—Matthew C. Zehrer

(57) ABSTRACT

A circuit module includes: a thermally conductive board forming a part of a housing; a circuit board disposed above the thermally conductive board; a semiconductor chip connected to a plurality of electrode pads on a upper surface of the circuit board through solder; a heat sink connected to a upper surface of the semiconductor chip; a thermally conductive member thermally connecting the thermally conductive board to the semiconductor chip; and a plurality of fasteners passing through the thickness of the circuit board in an area surrounding the semiconductor chip to attach the heat sink to the thermally conductive board.

10 Claims, 4 Drawing Sheets

CIRCUIT MODULE AND MANUFACTURING METHOD THEREOF

FIELD OF THE INVENTION

The present invention relates to a circuit module. In particular, the present invention relates to a structure for cooling semiconductor components in a circuit module and a method for manufacturing the structure.

BACKGROUND ART

Semiconductor components such as CPUs (MPUs) that consume a large amount of electric power also emit a large amount of heat during operation. In order to dissipate heat from the semiconductor components, a heat sink joined to the upper surfaces of the components has been used to remove (dissipate) heat. The effect of heat dissipation (cooling) can be increased by increasing the size of the heat sink. However, if the size of the whole circuit module is limited, it is often difficult to provide a large heat sink. This trend is being intensified by downsizings of circuit modules.

Semiconductor components are attached to a circuit board by soldering or the like. In that case, because the circuit board contains an insulating material, the thermal conductivity of the circuit board is so low that heat can hardly be dissipated through the circuit board. A fan is provided in a circuit module in order to facilitate heat dissipation from the heat sink. The cooling effect increases as airflow (the number of rotations) of the fan is increased. However, increasing the number of rotations of the fan poses the problem that noise of the fan also increases. Therefore, it is becoming increasingly important to find ways to increase the effect of cooling semiconductor components on circuit boards with the limited size of a heat sink and airflow of a fan.

SUMMARY OF THE INVENTION

In an embodiment of the present invention the effect of cooling semiconductor components on a circuit board is increased. In another embodiment of the present invention, the effect of cooling semiconductor components on a circuit board in a circuit module is increased while the size of a heat sink and the airflow of a fan are limited.

According to an embodiment of the present invention, there is provided a circuit module including: a thermally conductive board forming a part of a housing; a circuit board disposed above the thermally conductive board and having an upper surface including an opening and a plurality of electrode pads surrounding the opening and a lower surface opposite the upper surface; a semiconductor chip connected to the plurality of electrode pads on the upper surface of the circuit board through solder; a heat sink joined to the upper surface of the semiconductor chip; a thermally conductive member which thermally connecting the thermally conductive board to the semiconductor chip, being an elastic thermally conductive member, passing through the opening in the circuit board, one surface of the thermally conductive member being in contact with the lower surface of the semiconductor chip and the other surface of the thermally conductive member being in contact with a surface of the thermally conductive board; and a plurality of fasteners passing through the thickness of the circuit board in an area surrounding the semiconductor chip to attach the heat sink to the thermally conductive board in such a manner that the heat sink and the thermally conductive board are opposed to each other.

According to an embodiment of the present invention, there is provided a method for manufacturing a circuit module, including: providing a thermally conductive board forming a part of a housing; providing a circuit board having an upper surface including an opening and a plurality of electrode pads surrounding the opening and a lower surface opposite the upper surface, and having a semiconductor chip connected to the plurality of electrode pads on the upper surface through solder; joining a surface of the thermally conductive board to the semiconductor chip on the circuit board by means of a thermally conductive member, the thermally conductive member passing thorough the opening in the circuit board, one surface of the thermally conductive member being in contact with the lower surface of the semiconductor chip and the other surface being in contact with the surface of the thermally conductive board, and the thermally conductive member being elastic; joining a heat sink to the upper surface of the semiconductor chip; and attaching the heat sink to the thermally conductive board to each other by means of a plurality of fasteners, the fasteners passing through the thickness of the circuit board in an area surrounding the semiconductor chip to connect the heat sink to the thermally conductive board in such a manner that the heat sink and the thermally conductive board are opposed to each other.

According to an embodiment of the present invention, the effect of cooling a semiconductor chip on a circuit board can be improved by dissipating heat emitted from the semiconductor chip to both of the heat sink on the semiconductor chip and the thermally conductive board that forms a part of the housing below the semiconductor chip.

DETAILED DESCRIPTION OF THE DRAWINGS

Figure 1:
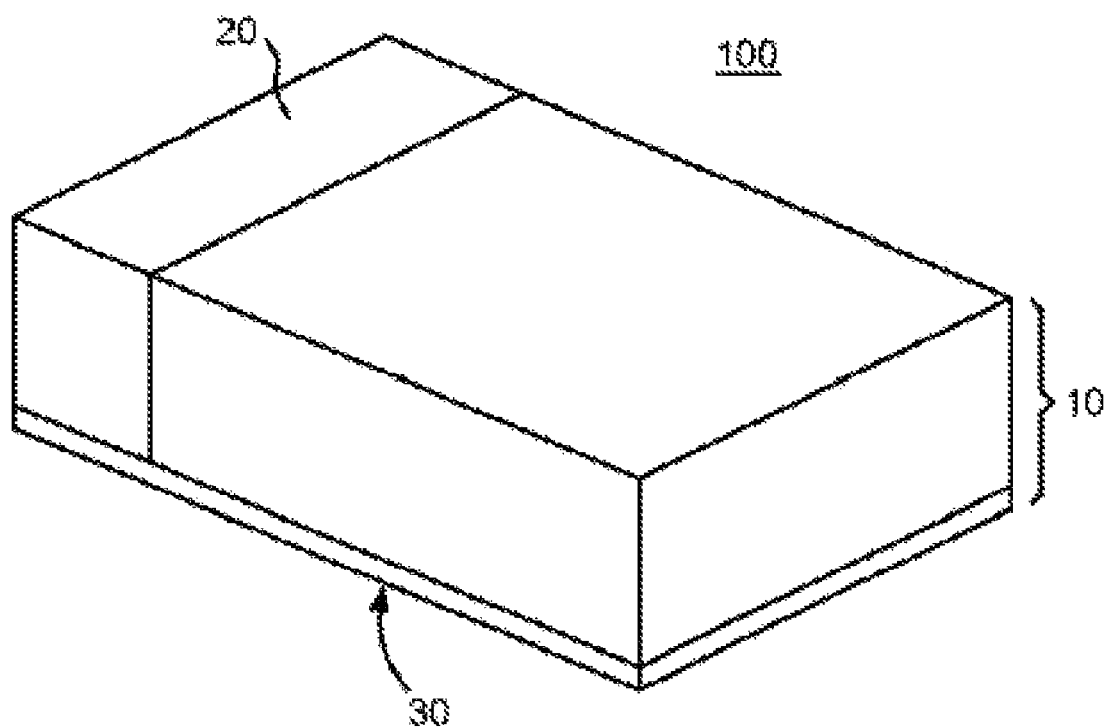
FIG. 1 is an external view showing one embodiment of a circuit module according to the present invention.

The embodiments of the present invention will be described in detail below with reference to the accompanying drawings. FIG. 1 is an external view of one embodiment of a circuit module according to the present invention. The circuit module 100 includes a housing 10 and a fan 20. While the fan 20 is joined to a sidewall of the housing 10 in FIG. 1, the present invention is not so limited. The fan may be contained inside the housing. The fan 20 provides ambient air into the housing. The housing 10 includes a bottom plate 30. The housing 10 is made of one or more of various materials, including a metal such as iron and aluminum or an insulating material. The bottom plate 30 of the housing 10 is made of a thermally conductive material such as a metal.

Figure 2:
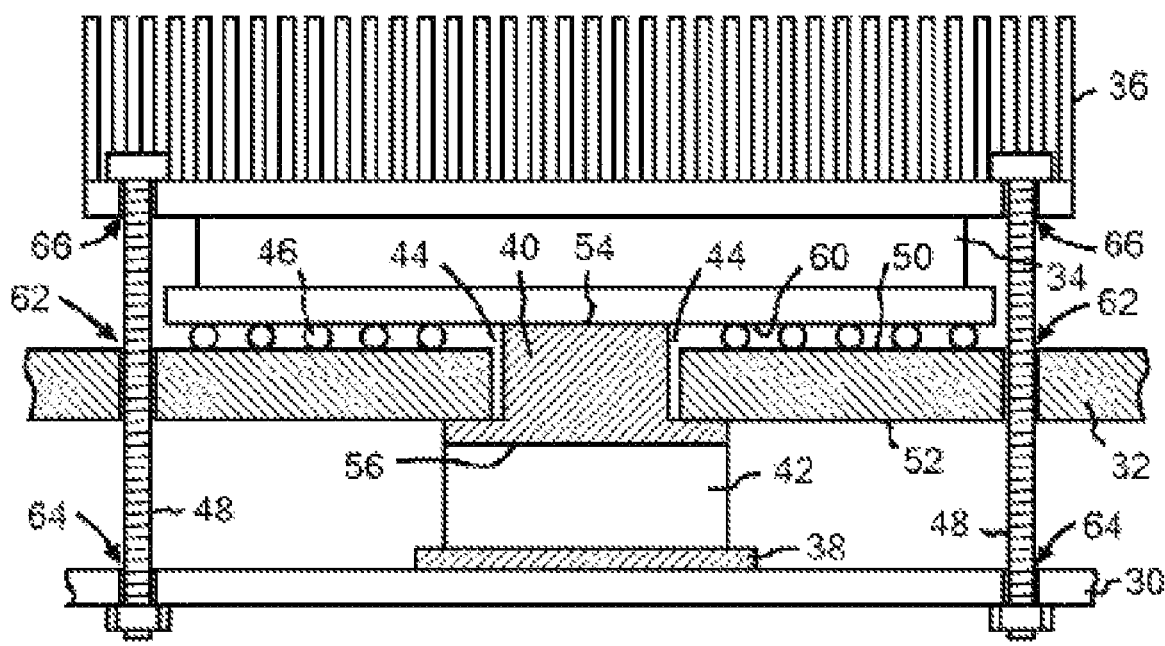
FIG. 2 is a cross-sectional view showing a part of the inside of the circuit module 100 in FIG. 1.

FIG. 2 is a diagram showing a part of a cross section of the inside of the circuit module 100 in FIG. 1. A circuit board 32 is disposed over the bottom plate 30 that forms a part of the housing 10. The circuit board 32 has an upper surface 50 including multiple electrode pads (not shown) and a lower surface 52 opposite the upper surface 50. A semiconductor chip 34 is joined to the multiple electrode pads on the upper surface 50 of the circuit board 32 through solder 46. The semiconductor chip 34 is joined by so-called flip-chip bonding using solder bolls. The semiconductor chip 34 may be, but not limited to, a semiconductor chip, such as a CPU (MPU) or an ASIC, that is relatively large in size and emits a relatively large amount of heat.

The circuit board 32 further includes an opening 44 below the semiconductor chip 34. A thermally conductive elastic member 40 is inserted in the opening 44 in the circuit board 32 in such a manner that the thermally conductive elastic member 40 is joined to the lower surface 60 of the semiconductor chip. The thermally conductive elastic member 40 has a flat upper surface 54 and a flat lower surface 56 opposite the upper surface 54. The area of the lower surface 56 is greater than that of the upper surface 54. The area of the upper surface 54 is slightly smaller than or equal to that of the opening 44. The thermally conductive elastic member 40 may be a sheet of thermally conductive gel (rubber), for example.

A thermally conductive member 42 is joined to the lower surface 56 of the thermally conductive elastic member 40. The thermally conductive member 42 is desirably made of a metal (electrically conductive material) having a high thermal conductivity such as copper or aluminum. The thermally conductive member 42 may be a solid such as a rectangular parallelepiped or circular cylinder in shape or include one or more springs. A thermally conductive elastic member 38 is provided between the thermally conductive member 42 and the bottom plate 30. The upper surface of the thermally conductive elastic member 38 is in contact with the lower surface of the thermally conductive member 42 and the opposite, lower surface of the thermally conductive elastic member 38 is in contact with the surface of the bottom plate 30. Like the thermally conductive elastic member 40, the thermally conductive elastic member 38 may be a sheet of thermally conductive gel (rubber), for example. Alternatively, the elastic member 38 may be a less viscous material such as a thermally conductive grease.

A heat sink 36 is provided over the semiconductor chip 34. The term "heat sink" as used herein is synonymous with a heat dissipating device. The heat sink is typically made of a metal having a high thermal conductivity such as aluminum or copper. A thermally conductive material such as a thermally conductive grease or a thermally or electrically conductive adhesive may be provided between the semiconductor chip 34 and the heat sink 36. As shown in FIG. 2, the heat sink 36 has multiple fins for dissipating heat. The heat sink 36 and the bottom plate 30 are attached to each other by means of screws 48 in such a manner that they are opposed to each other. The screws 48 pass through the circuit board in an area 62 surrounding the semiconductor chip. The screws 48 fix the components from the heat sink 36 to the thermally conductive elastic member 38, inclusive, to the bottom plate 30. The screws 48 are desirably made of a thermally conductive material such as a metal because heat can be transferred from the heat sink 36 to the bottom plate 30 through the screws 48. The screws 48 are provided in regions on the circuit board near the four corners of the semiconductor chips, for example.

Figure 3:
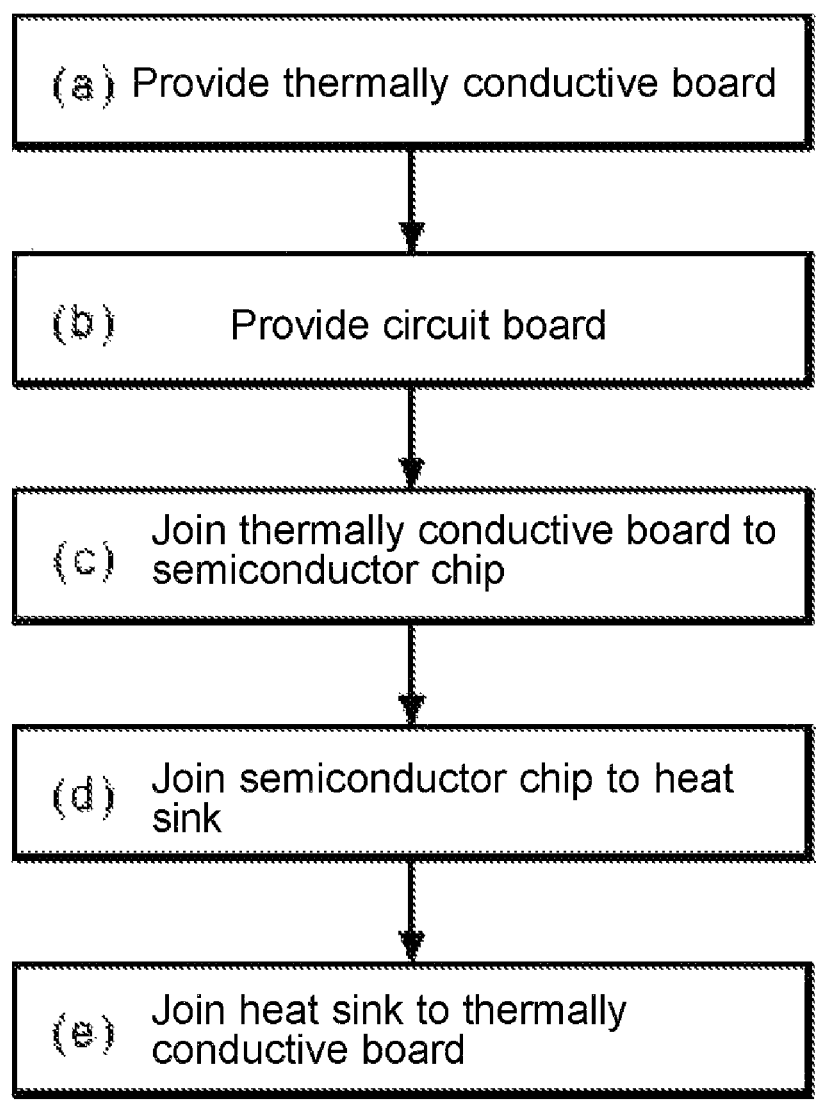
FIG. 3 is a diagram showing a flow of a method for manufacturing a circuit module according to the present invention.

FIG. 3 shows a flow of a method for manufacturing a circuit module according to the present invention. The same reference numerals as those used for the structure shown in FIG. 2 will be used in the following description. The manufacturing method described below is also applicable to structures that differ from the structure of the embodiment shown in FIG. 2, of course. At step (a) a thermally conductive board 30 that is a part of a housing is provided. Multiple through-holes 64 are provided in the thermally conductive board 30 for screws 48 beforehand appropriately to the size of a heat sink which will be attached later. At step (b), a circuit board 32 is provided. Details of the circuit board 32 have been described in the description of FIG. 2. In addition, through-holes 62 for screws 48 used in a later step (e) are provided in the circuit board 32 beforehand. The positions of the through-holes 62 are determined so that the through-holes 62 align with the through-holes 64 in the thermally conductive board 30 when screwing.

At step (c), the surface of the thermally conductive board 30 is joined to a semiconductor chip 34 above the circuit board 32 by means of thermally conductive members 38, 40, and 42. At step (c), first the thermally conductive elastic member 40 is inserted in an opening 44 in the circuit board 32 until the elastic member 40 comes into contact with the lower surface 60 of the semiconductor chip 34. The elastic member 40 has been worked beforehand into a shape having predetermined dimensions based on dimensions such as the size of the opening 44 and the distance between the lower surface of the semiconductor chip 34 and the lower surface 52 of the circuit board. The area of the upper surface 54 of the elastic member 40 in the example in FIG. 2 is smaller than that of the lower surface. The elastic member 40 is a sheet of thermally conductive gel (rubber), for example, as described above. Then, the thermally conductive board 30 is placed under the circuit board 32 and the thermally conductive elastic member 38 is attached to an area on the surface of the thermally conductive board 30 below the opening 44 in the circuit board 32. The elastic member 38 is attached to the surface of the thermally conductive board 30 directly or through a thermally conductive adhesive or grease. The elastic member 38 has been worked beforehand into a shape having predetermined dimensions based on dimensions such as the size of the elastic member 40 and the distance between the lower surface of the semiconductor chip 34 and the lower surface 52 of the circuit board.

Then, the thermally conductive member 42 is attached between the two thermally conductive elastic members 38 and 40 in such a manner that the thermally conductive member 42 comes into contact with the surfaces of the two elastic members. The thermally conductive member 42 has been worked beforehand so as to conform to the sizes and shapes of the two thermally conductive elastic members 38 and 40. In the example in FIG. 2, the thermally conductive member 42 is worked so that the area of the upper surface of the thermally conductive member 42 is approximately equal to the area of the lower surface 56 of the thermally conductive elastic member 40. The thermally conductive member 42 may be attached after the thermally conductive elastic member 40 is inserted in the opening 44 in the circuit board 32. In that case, the thermally conductive member 42 is attached in such a manner that the thermally conductive member 42 comes into close contact with the lower surface 56 of the elastic member 40. For the attachment, a thermally conductive adhesive or the like is used if needed. The three members 38, 40, and 42 may be joined together into one component and the component may be placed between the lower surface of the semiconductor chip 34 and the surface of the thermally conductive board 30.

At step (d), the heat sink 36 is joined to the upper surface of the semiconductor chip 34. The heat sink 36 has been worked beforehand so as to conform to the size of the semiconductor chip 34. The area of the junction of the heat sink 36 with the semiconductor chip 34 is made greater than the surface area of the semiconductor chip 34. This is because through-holes 66 for screws 48 need to be provided in the heat sink 36. The through-holes 66 are positioned so that they align with the through-holes 64 in the thermally conductive board 30 and the through-holes 64 in the circuit board. The semiconductor chip 34 and the heat sink 36 are joined to each other directly or by means of a thermally conductive material, such as thermally conductive grease or an electrically conductive adhesive.

At step (e), the heat sink 36 and the thermally conductive board 30 are attached together by means of multiple fasteners (screws 48). The heat sink 36 and the thermally conductive board 30 are attached together in such a manner that the heat sink 36 and the thermally conductive board 30 are opposed to each other. In the example in FIG. 2, each screw 48 consists of a bolt and nut. The bolts are inserted from the heat sink side, are passed through the through-holes 62 in the circuit board 32 and the through-holes 64 in the thermally conductive board 30, and are fixed by tightening the nuts on the lower surface of the thermally conductive board 30. While the nuts are being tightened, the thermally conductive elastic members 38 and 40 act as a kind of buffer to absorb the tightening force adequately to prevent an excessive force from being applied to the semiconductor chip 34. This prevents damage to the semiconductor chip 34 or separation of the solder 46.

Figure 4:
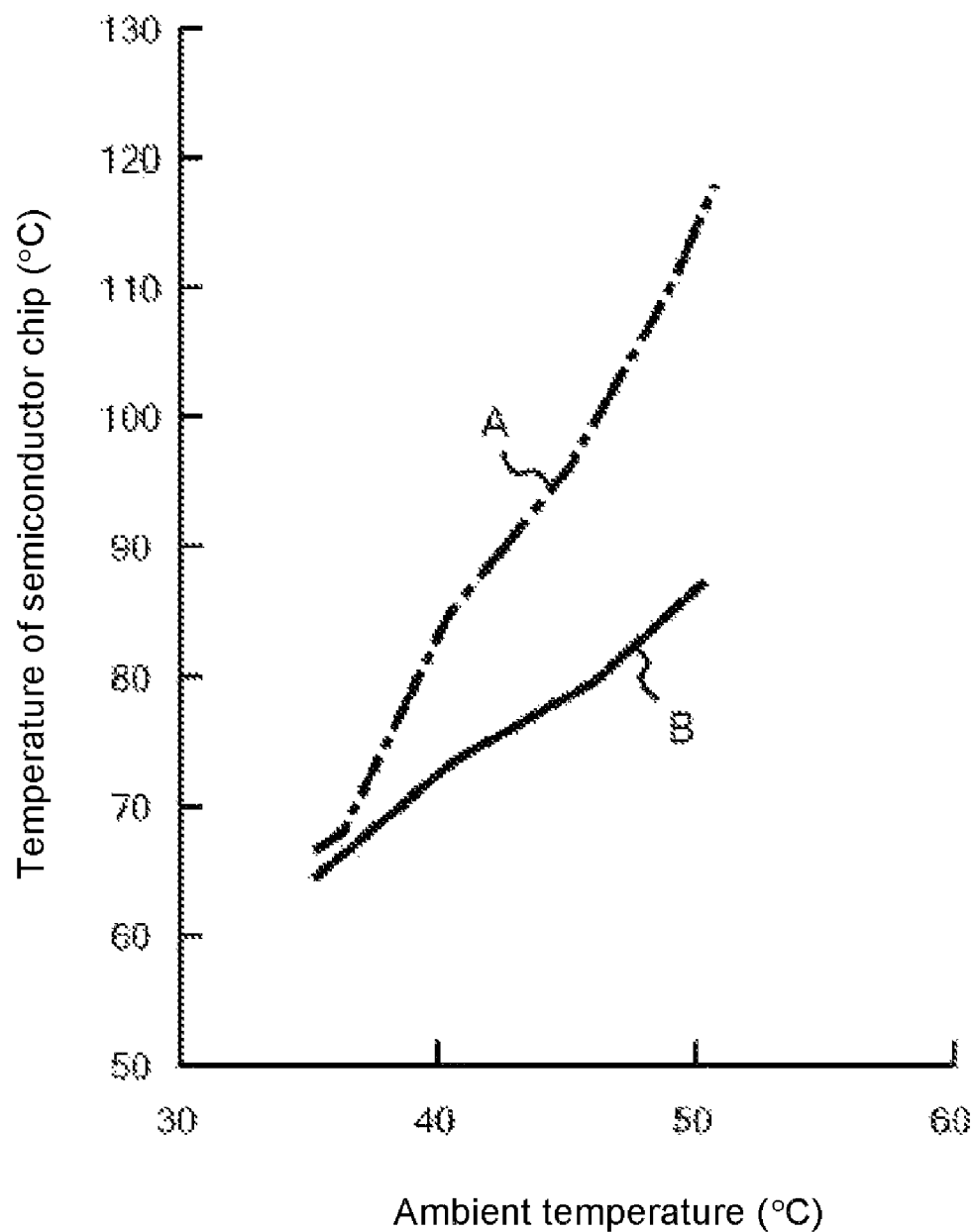
FIG. 4 is a diagram showing the cooling effect of a structure shown in FIG. 2.

FIG. 4 shows the cooling effect when the structure in FIG. 2 is used. The vertical axis represents the temperature of semiconductor chips and the horizontal axis represents the ambient temperature. Here, the ambient temperature is the temperature of air outside the housings. Curve A shown represents changes in temperature of a conventional structure that does not use the thermally conductive members 38, 40, and 42 in FIG. 2, that is, a conventional structure that uses only a heat think. Curve B represents changes in temperature of the structure shown in FIG. 2, which is one exemplary embodiment of the present invention. As apparent from the figure, the exemplary embodiment of the present invention (the structure in FIG. 2) can reduce the temperature of the semiconductor chip to a temperature lower by 30 degrees Celsius than the conventional structure can at an ambient temperature of 50 degrees Celsius, for example. That is, it has been demonstrated that the temperature of the semiconductor chip can be further decreased by dissipating heat emitted by the semiconductor chip by dissipating heat from the semiconductor chip to the thermally conductive board that forms a part of the housing through the thermally conductive member.

The present invention has been described with respect to FIGS. 1 to 4 by way of example. However, the present invention is not limited to these examples. It will be apparent to those skilled in the art that any variations are possible without departing from the spirit of the present invention.

What is claimed is:

1. A circuit module comprising:
   a thermally conductive a housing;
   a circuit board disposed inside the thermally conductive housing above a bottom of the thermally conductive housing comprising an upper surface comprising an opening and a plurality of electrode pads surrounding the opening and a lower surface opposite the upper surface;
   a semiconductor chip connected with solder to the plurality of electrode pads on the upper surface of the circuit board;
   a heat sink connected to the upper surface of the semiconductor chip;
   a thermally conductive structure for thermally connecting the thermally conductive housing to the semiconductor chip, wherein the thermally conductive structure has elasticity, wherein the thermally conductive structure passes through the opening in the circuit board, and wherein one surface of the thermally conductive structure is in contact with the lower surface of the semiconductor chip and the other surface of the structure is in contact with a surface of the thermally conductive housing, and;
   a plurality of fasteners passing through the thickness of the circuit board in an area surrounding the semiconductor chip to attach the heat sink to the thermally conductive housing such that the heat sink and the thermally conductive housing are opposed to each other.

2. The circuit module according to claim 1, wherein the thermally conductive structure having elasticity comprises a thermally conductive member and thermally conductive elastic members provided on upper and lower surfaces of the thermally conductive member.

3. The circuit module according to claim 2, wherein the thermally conductive member comprises a metal.

4. The circuit module according to claim 3, wherein the plurality of fasteners comprise screws.

5. The circuit module according to claim 4, wherein the screws are thermally conductive.

6. The circuit module according to claim 1, wherein the heat sink includes a plurality of fins.

7. The circuit module according to claim 1, wherein the heat sink is connected to the upper surface of the semiconductor chip through a thermally conductive member.

8. A method for manufacturing a circuit module, comprising:
   providing a thermally conductive housing;
   providing inside the thermally conductive housing above a bottom of the housing a circuit board comprising an upper surface having an opening and a plurality of electrode pads surrounding the opening and a lower surface opposite the upper surface, the circuit board further comprising a semiconductor chip connected to the plurality of electrode pads with solder on the upper surface;
   joining a surface the bottom of the thermally conductive housing to the semiconductor chip on the circuit board with a thermally conductive member, the thermally conductive member passing thorough the opening in the circuit board, one surface of the thermally conductive member being in contact with the lower surface of the semiconductor chip and the other surface being in contact with the surface of the thermally conductive housing, and wherein the thermally conductive member is elastic;
   joining a heat sink to the upper surface of the semiconductor chip; and
   attaching the heat sink and the thermally conductive housing to each other with a plurality of fasteners, the fasteners passing through the thickness of the circuit board in an area surrounding the semiconductor chip to connect the heat sink to the thermally conductive housing in such a manner that the heat sink and the thermally conductive housing are opposed to each other.

9. The manufacturing method according to claim 8, wherein joining the surface of the thermally conductive housing to the semiconductor chip on the circuit board comprises:
   inserting a first thermally conductive elastic member in the opening in the circuit board until the first thermally conductive elastic member comes into contact with the lower surface of the semiconductor chip;
   placing the thermally conductive board below the circuit board and disposing a second thermally conductive elastic member on the surface of the thermally conductive board below the opening in the circuit board; and
   providing a thermally conductive member between the first and second thermally conductive elastic members in such a manner that the thermally conductive member is brought into contact with surfaces of the two thermally conductive elastic members.

10. The manufacturing method according to claim 8, wherein attaching the heat sink to the thermally conductive housing comprises fastening the heat sink and the thermally conductive housing to each other by means of screws in such a manner that the heat sink and the thermally conductive housing are opposed to each other.

* * * * *